United States Patent
Tasaki

(10) Patent No.: US 8,907,528 B2
(45) Date of Patent: Dec. 9, 2014

(54) SEMICONDUCTOR DEVICE

(75) Inventor: Yoshio Tasaki, Itami (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 623 days.

(21) Appl. No.: 13/286,198

(22) Filed: Oct. 31, 2011

(65) Prior Publication Data
US 2012/0104854 A1 May 3, 2012

(30) Foreign Application Priority Data
Nov. 1, 2010 (JP) .................................. 2010-245204

(51) Int. Cl.
H01H 47/00 (2006.01)
H02M 1/14 (2006.01)

(52) U.S. Cl.
CPC .......... *H02M 1/14* (2013.01); *H01L 2924/0002* (2013.01)
USPC ...................................................... 307/113

(58) Field of Classification Search
USPC ........................................................ 307/113
See application file for complete search history.

(56) References Cited

U.S. PATENT DOCUMENTS 7,545,057 B1 * 6/2009 Roo et al. .................. 307/116

FOREIGN PATENT DOCUMENTS

JP 9-205357 A 8/1997
JP 2003-258612 A 9/2003

* cited by examiner

*Primary Examiner* — Rexford Barnie
*Assistant Examiner* — Dru Parries
(74) *Attorney, Agent, or Firm* — Miles & Stockbridge P.C.

(57) ABSTRACT

There is provided a semiconductor device in which an influence of a power source noise is suppressed and the number of pins and the area of the semiconductor device are reduced. A power source line for a first internal circuit and a power source line for a second internal circuit are coupled to a common pin terminal. A ground line for the first internal circuit and a ground line for the second internal circuit are coupled to another common pin terminal. A power source noise generated on the power source line for the first internal circuit during an operation of the first internal circuit is absorbed by a P-channel MOS transistor and a capacitor. A power source noise generated on the ground line is absorbed by an N-channel MOS transistor and the capacitor.

2 Claims, 7 Drawing Sheets

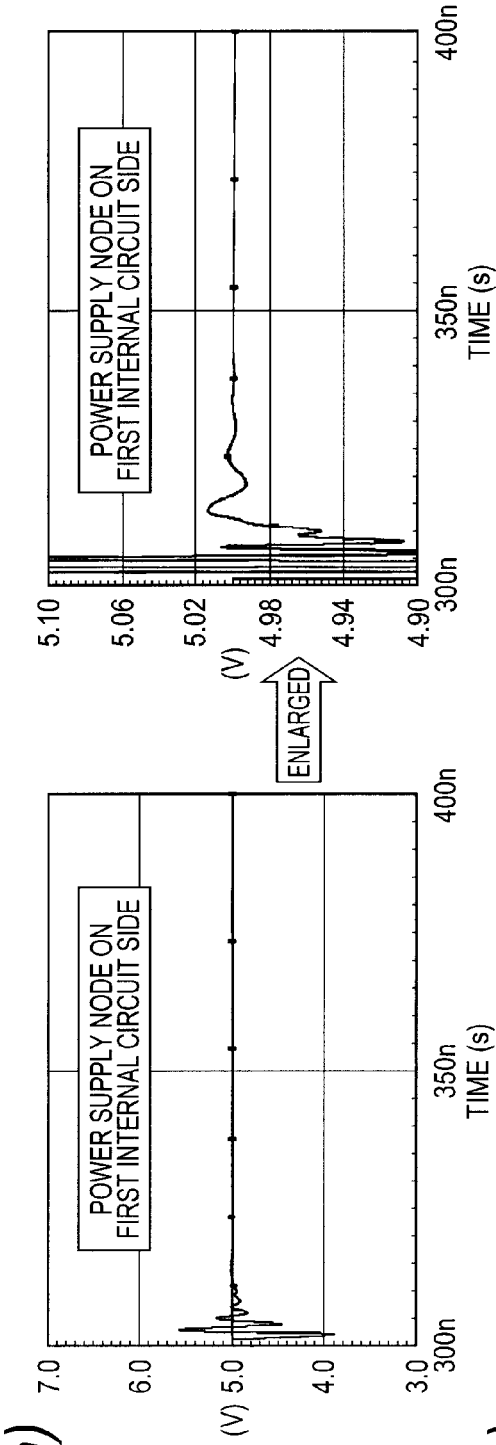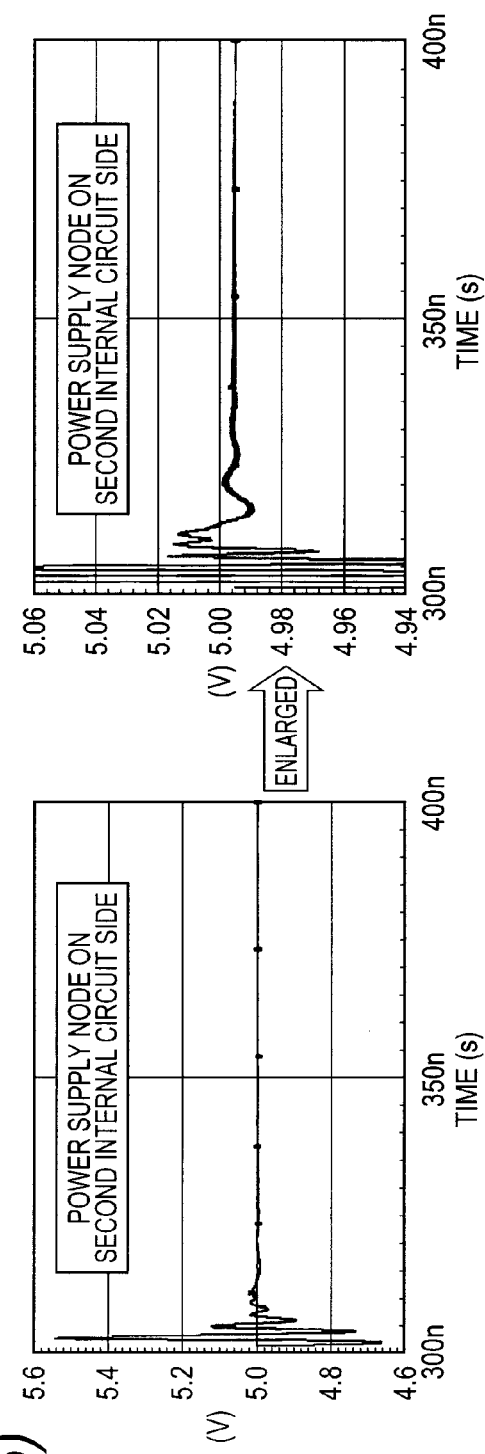
FIG. 5(a)
FIG. 5(b)

SEMICONDUCTOR DEVICE

CROSS-REFERENCE TO RELATED APPLICATIONS

The disclosure of Japanese Patent Application No. 2010-245204 filed on Nov. 1, 2010 including the specification, drawings and abstract is incorporated herein by reference in its entirety.

BACKGROUND

The present invention relates to a semiconductor device and, more particularly, to a structure for reducing the influence of a power source noise generated during an operation of an internal circuit.

Today, various electric products are mounted with semiconductor integrated circuits (LSI) such as a micro computer, a memory, and a gate array. As to the LSI, from a view point of size reduction of a package in which the LSI is sealed, there have been studies for reducing the number of pin terminals. As a method to reduce the number of pins, for example, a structure is adopted in which the number of necessary pin terminals is reduced by allowing two or more internal circuits mounted in the LSI to share a common pin terminal (power source pin terminal) for supplying power source voltage.

However, as described above, in the case where there is provided a common power source pin terminal to be shared by the two or more internal circuits, a power source line and a ground line for one internal circuit are electrically coupled with a power source line and a ground line for another internal circuit through the power source pin terminal. Therefore, there is transmitted, to the power source line and the ground line of another internal circuit through the power source pin terminal, a noise (hereafter called a "power source noise") generated on the power source line and the ground line at the time of an operation of the first internal circuit. This power source noise is a high-frequency component produced by a rapid change in an electric current. With higher integration of LSI in recent years, for reducing power consumption and faster operation, it is commonly performed to lower power source voltage. Therefore, the influence of the power source noise given to the power source voltage becomes greater, which may cause malfunction of other internal circuits.

In order to reduce such an influence of the power source noise, in a semiconductor device disclosed in Japanese Patent Laid-open No. Hei 9 (1997)-205357 (Patent Document 1), for example, there is provided a decoupling capacitor between a power source line and a ground line. The power source noise is absorbed by the decoupling capacitor so that the power source noise is prevented from being transmitted to other internal circuits. Moreover, Patent Document 1 discloses a structure in which there is formed a low pass filter with use of a resistor inserted in the power source line and a capacitor provided between the power source line and the ground line, and the power source noise on the power source line is absorbed by the low pass filter.

[Patent Document 1]
Japanese Patent Laid-open No. Hei 9 (1997)-205357
[Patent Document 2]
Japanese Patent Laid-open No. 2003-258612

SUMMARY

However, in the semiconductor device described in Patent Document 1, in order to suppress the power source noise of the Power source voltage and ground voltage for the internal circuit, it becomes necessary to mount a decoupling capacitor having a significant capacity value (about several nH) on a chip, which increases a circuit area of the semiconductor device.

Moreover, in order to absorb the power source noise by the low pass filter including a resistor and a capacitor, it is necessary to insert, in the power source line and the ground line, a resistor having a significant resistance value for effectively filtering a high frequency component, reducing the power source voltage in the resistor.

The present invention is made in view of the above, and its object is to suppress the influence of the power source noise at the time of an operation of the internal circuit and to provide a semiconductor device in which the number of pins and a circuit area are reduced.

According to one aspect of the present invention, the semiconductor device includes: a first circuit supplied with the first power source potential and a second power source potential; a second operating circuit supplied with the first power source potential and a second power source potential which is lower than the first power source potential; a first terminal which receives the first power source potential given from the outside; a second terminal for receiving the second power source potential given from the outside; a first power source supply line for electrically coupling the first terminal with the first circuit; a second power source supply line for electrically coupling the second terminal with the first circuit; a third power source supply line for electrically coupling the first terminal with the second circuit; a fourth power source supply line for electrically coupling the second terminal with the second circuit; a capacitive element coupled between the first power source supply line and the second power source supply line; a first conductive-type field-effect transistor which is inserted in and coupled to the first power source supply line and whose gate is coupled to the second power source supply line; and a second conductive-type field-effect transistor which is inserted in and coupled to the second power source supply line and whose gate is coupled to the first power source supply line.

According to the present invention, even when two or more internal circuits are coupled with a common pin terminal, it becomes possible to prevent a power source noise generated during an operation of an internal circuit from affecting another internal circuit. As a result, the number of pins and area of the semiconductor device can be reduced.

BRIEF DESCRIPTION OF THE DRAWINGS

FIG. 5 is a diagram illustrating a filter effect for a power source noise in the semiconductor device according to the present embodiment;

DETAILED DESCRIPTION

Figure 1:
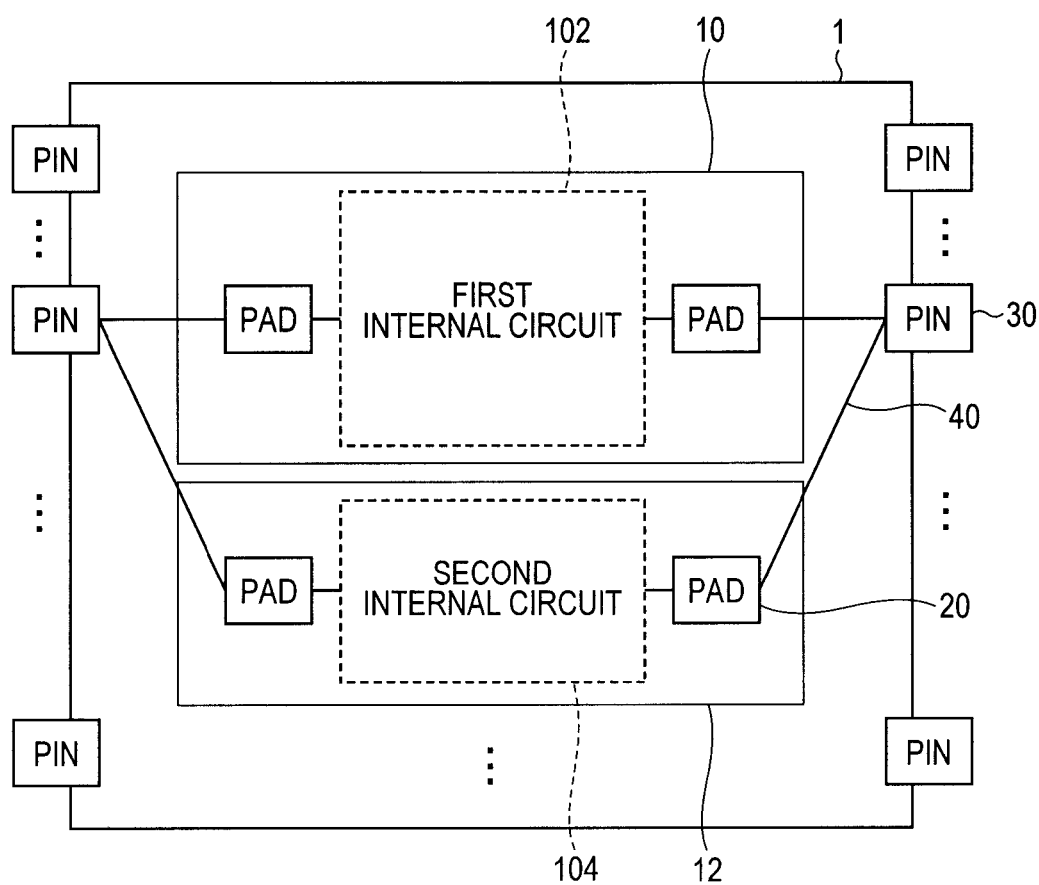
FIG. 1 is a schematic diagram showing an overall configuration of a semiconductor device according to an embodiment of the present invention.

The embodiments of the present invention will be described more specifically. In all of the drawings, members having like functions will be identified by like reference characters or numerals, and overlapping descriptions thereof will be basically omitted.

FIG. 1 is a schematic diagram showing an overall structure of a semiconductor device according to an embodiment of the present invention.

Referring to FIG. 1, the semiconductor device 1 according to the present embodiment includes: two or more semiconductor chips; and two or more pin terminals 30 arranged along the circumference of the two or more semiconductor chips. In FIG. 1, of the two or more semiconductor chips, a first semiconductor chip 10 and a second semiconductor chip 12 are typically shown.

The first semiconductor chip 10 includes a first internal circuit 102 and a pad 20 for supplying a power source voltage to the first internal circuit 102. Similarly, the second semiconductor chip 12 includes a second internal circuit 104 and a pad 20 for supplying a power source voltage to the second internal circuit 104.

Though not shown, each of the semiconductor chips 10 and 12 further includes, other than the pad 20 for supplying the power source voltage to the internal circuit, two or more pads for outputting and inputting signals or data.

The pad 20 of the first semiconductor chip 10 is electrically coupled to a pin terminal 30 through a bonding wire 40. The pad 20 of the second semiconductor chip 12 is electrically coupled to the same pin terminal 30 through the bonding wire 40. Therefore, the power source voltage is supplied from the common pin terminal 30 to the first internal circuit 102 and the second internal circuit 104.

Thus, with the above structure in which two or more semiconductor chips share one pin terminal, the number of pins of the semiconductor device can be reduced.

Figure 2:
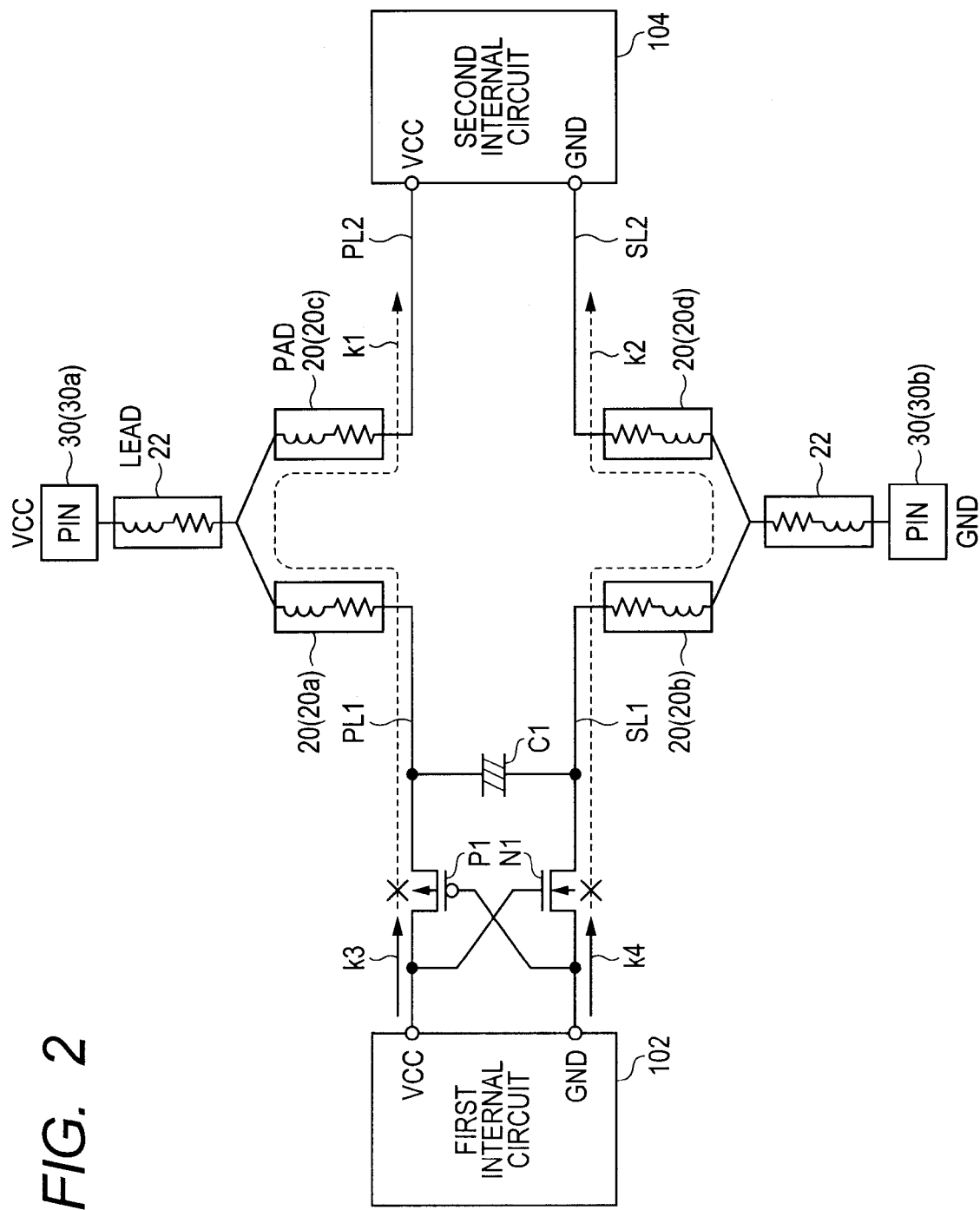
FIG. 2 shows a configuration of a principal part of the semiconductor device shown in FIG. 1.

FIG. 2 shows a structure of a principal part of the semiconductor device 1 shown in FIG. 1. Referring to FIG. 2, a power source voltage VCC is supplied to the pin terminal 30 (shown by reference numeral 30a in FIG. 2). The pad 20a of the first internal circuit 102 is electrically coupled to the pin terminal 30a through a lead 22. The first internal circuit 102 receives one power source voltage (a first power source voltage) through a power source line PL1 from the pad 20a which receives the power source voltage VCC. A pad 20c of the second internal circuit 104 is electrically coupled to the same pin terminal 30a through the lead 22. The second internal circuit 104 receives one power source voltage from the pad 20c which receives the power source voltage VCC through a power source line PL2.

A ground voltage GND is supplied to a pin terminal 30 (shown by reference numeral 30b in FIG. 2). A pad 20b of the first internal circuit 102 is electrically coupled to the pin terminal 30b through a lead 22. The first internal circuit 102 receives the other power source voltage (a second power source voltage lower than the first power source voltage) from the pad 20b which receives the ground voltage GND through a ground line SL1. A pad 20d of the second internal circuit 104 is electrically coupled to the same pin terminal 30b through the lead 22. The second internal circuit 104 receives the other power source voltage through the ground line SL2 from the pad 20d which receives the ground voltage GND.

The first internal circuit 102 receives, through the power source line PL1 coupled to the pad 20a, one power source voltage at a power supply node VCC and, also, receives the other power source voltage, through the ground line SPL1 coupled to the pad 20b, at a ground node GND. A P-channel MOS transistor P1 is inserted between the power supply node VCC of the first internal circuit 102 and the power source line PL1. A gate of the P-channel MOS transistor P1 is coupled to the ground line SL1. Therefore, when a potential of the ground line SL1 is raised higher than a threshold voltage of the P-channel MOS transistor P1, the P-channel MOS transistor P1 is turned off.

Moreover, an N-channel MOS transistor N1 is inserted between the ground node GND of the first internal circuit 102 and the ground line SL1. A gate of the N-channel MOS transistor N1 is coupled to the power source line PL1. Therefore, when a potential of the power source line PL1 falls below a threshold voltage of the N-channel MOS transistor N1, the N-channel MOS transistor N1 is turned off.

Furthermore, a capacitor C1 having a significant capacity value is placed between the power source line PL1 and the ground line SL1. The capacitor C1 includes, for example, a MOS capacitor. Because the capacitor C1 includes the MOS capacitor, a capacitor occupying less area and having a larger capacity value can be realized.

The second internal circuit 104 receives one power source voltage at the power supply node VCC through the power source line PL2 coupled to the pad 20c and, also, receives the other power source voltage at the ground node GND through the ground line SL2 coupled to the pad 20d. Also, a capacitor having a significant capacity value is not provided between the power source line PL2 and the ground line SL2. Therefore, a stray capacity alone exists between the power source line PL2 and the ground line SL2. The stray capacity has a capacity value of about several pF, and the power source line PL2 and the ground line SL2 are separated in terms of alternating current. The amount of change in potential due to a capacity coupling is proportional to the capacity value of the capacitor. Therefore, when the capacity value of the stray capacity is small enough, even if a noise occurs in either the power source line PL2 or the ground line SL2, the magnitude of the noise transmitted to the other side becomes small enough.

Common pin terminals 30a and 30b are provided to be shared by the first internal circuit 102 and the second internal circuit 104. It is assumed that, as compared to the second internal circuit 104, an electric current driving force of the first internal circuit 102 is large enough and a noise which occurs at least at one of the power source line PL1 and the ground line SL1 during the operation (hereafter called a "power source noise") is big. The power source line PL1 and the ground line SL1 for the first internal circuit 102 and the power source line PL2 and the ground line SL2 for the second internal circuit 104 are electrically coupled through the pin terminals 30a and 30b. Therefore, the power source noise generated at the time of an operation of the first internal circuit 102 may be transmitted to the power source line PL2 and the ground line SL2. When the second internal circuit 104 is an analog circuit (for example, an analog-to-digital converter etc.) which is easily affected by a power source noise, there may occur malfunctions such as a case where a time lag of the circuit may vary or data of a logic circuit may be reversed. Also, the first internal circuit 102 corresponds to a circuit where precision of the operation is not asked for even when there is a slight fall in the power source voltage, such as a charging-pump circuit mounted in a flash memory.

In the structure shown in FIG. 2, when the first internal circuit 102 is operated and a power source noise is generated in the power source line PL1, as shown by an arrow k1 in FIG. 2, the power source noise may be transmitted to the power supply node VCC of the second internal circuit 104 through the pad 20a, the lead 22, the pin terminal 30a, the Pad 20c, and the power source line PL2, in this order. Similarly, when the first internal circuit 102 is operated and a power source noise is generated in the ground line SL1, as shown by an arrow k2 in FIG. 2, the power source noise may be transmitted to the ground node GND of the second internal circuit 104 through the Pad 20b, the a lead 22, the pin terminal 30b, the pad 20d, and the ground line SL2, in this order.

However, the power source noise generated in the power source line PL1 during the operation of the first internal circuit 102 is filtered and absorbed by the low pass filter including the P-channel MOS transistor P1 and the capacitor C1. Similarly, the power source noise generated in the ground line SL1 during the operation of the first internal circuit 102 is filtered and absorbed by the low pass filter including the N-channel MOS transistor N1 and the capacitor C1. Consequently, as shown by arrows k3 and k4 in FIG. 2, the power source noise generated during the operation of the first internal circuit 102 can be prevented from being transmitted to the power source line PL2 or the ground line SL2 through the pin terminals 30a and 30b.

Figure 3:
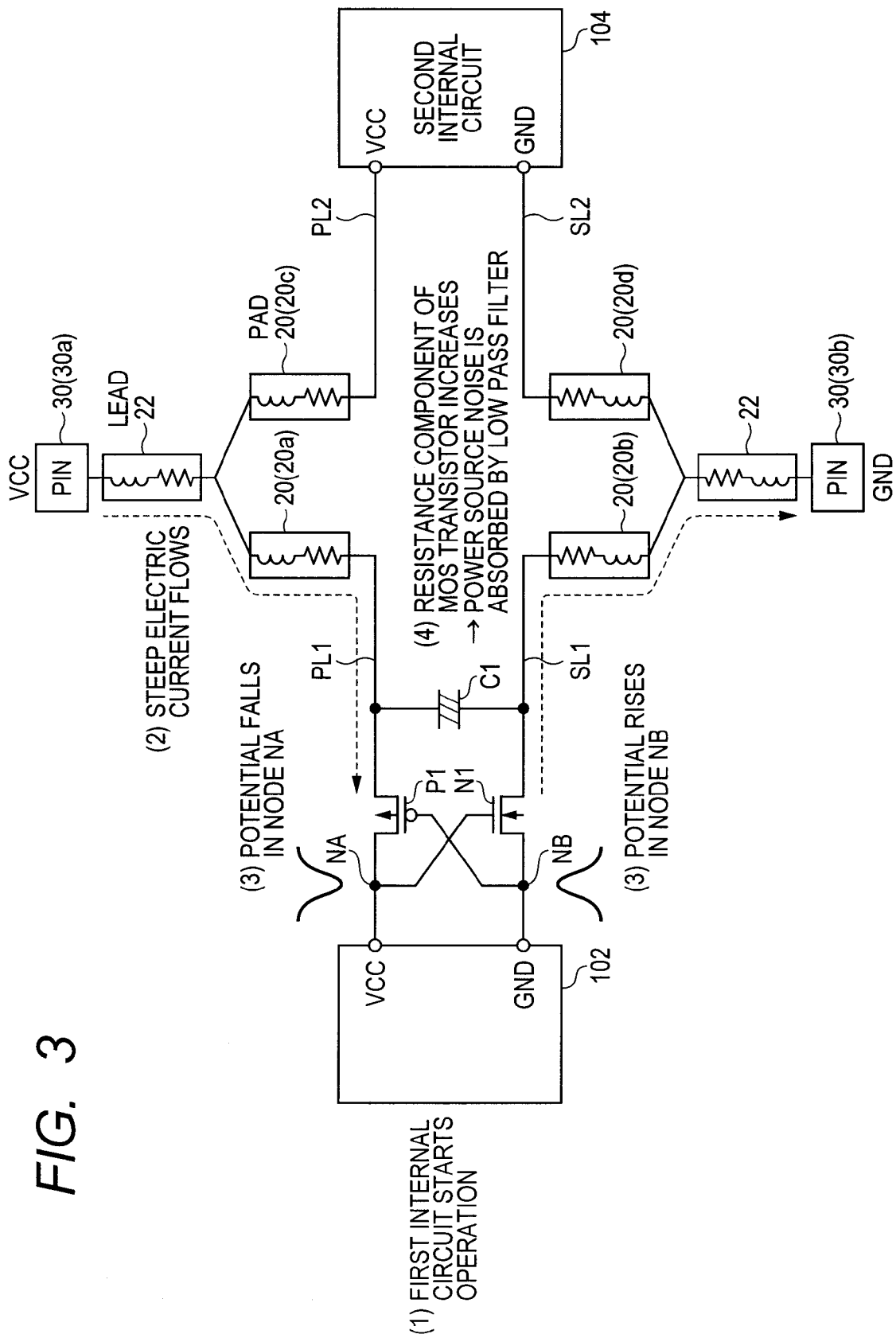
FIG. 3 is a diagram illustrating an operation of the semiconductor device shown in FIG. 2.

FIG. 3 is a diagram illustrating an operation of the semiconductor device 1 shown in FIG. 2. In the structure shown in FIG. 3, when the first internal circuit 102 receives the power source voltage VCC on the power source line PL1 and, also, the ground voltage GND on the ground line SL1 and starts its operation (refer to (1) in FIG. 3), as shown by (2) in FIG. 3, a steep electric current flows in the power source line PL1. When this electric current flows through the lead 22, the pad 20a, and a parasitic inductance of the power source line PL1, as shown by (3) in FIG. 3, there occurs a steep drop in potential (power source noise) in a node NA on the power source line PL1. The power source noise generated in the power source line PL1 contains a component expressed by $L \cdot dI/dt$, where L is a parasitic inductance of a power source system and $dI/dt$ is a time-varying electric current.

Moreover, from the first internal circuit 102, a steep electric current is discharged onto the grounding line SL1. At this time, the ground line SL2 cannot absorb all of the large electric current discharged from the first internal circuit 102. Consequently, as shown by (3) in FIG. 3, there occurs a steep rise in potential (power source noise) in a node NB on the ground line SL1.

When the potential on the power source line PL1 falls steeply, as shown by (4) in FIG. 3, in an N-channel MOS transistor N1 which receives the potential of the power source line PL1 in its gate, an on-resistance increases due to the fall in the gate potential. The low pass filter is formed by using a resistance component of the N-channel MOS transistor N1 and the capacitor C1. As a result, the power source noise generated in the ground line SL1 during the operation of the first internal circuit 102 is filtered and absorbed by the low pass filter. Thus, the power source noise is prevented from being transmitted to the ground line SL2 of the second internal circuit 104 through the pin terminal 30b.

Similarly, when a potential on the ground line SL1 rises steeply, in the P-channel MOS transistor P1 which receives the potential of the ground line SL1 in its gate, an on-resistance increases due to the rise in the gate potential. A low pass filter is formed by using a resistance component of the P-channel MOS transistor P1 and the capacitor C1. Therefore, the power source noise generated in the power source line PL1 during the operation of the first internal circuit 102 is filtered and absorbed by the low pass filter. As a result, the power source noise can be prevented from being transmitted to the power source line PL2 of the second internal circuit 104 through the pin terminal 30a.

As described above, there are provided low pass filters in the power source line PL1 and the ground line SL1, respectively. Therefore, the power source noise generated in the power source line PL1 or the ground line SL1 during the operation of the first internal circuit 102 is absorbed by the low pass filter, and is prevented from being transmitted to the power source line PL2 or the ground line SL2 of the second internal circuit 104 through the pin terminals 30a and 30b. As a result, the second internal circuit 104 can be operated stably.

Further, the low pass filter is inserted in the power source line PL1, and is formed by using a resistance component of the P-channel MOS transistor P1 which receives a potential of the ground line SL1 at its gate and the capacitor C1. The resistance component of the P-channel MOS transistor P1 increases or decreases according to the potential of the node NB on the ground line SL1 which varies according to the magnitude of the power source noise. To be specific, when the power source noise increases, the amount of rise in the potential of the node NB increases. Therefore, the resistance component of the P-channel MOS transistor P1 also increases. On the other hand, when the power source noise decreases, the amount of rise in the potential of the node NB decreases. Therefore, the resistance component of the P-channel MOS transistor P1 is also reduced in size.

As described above, when the magnitude of the resistance component of the P-channel MOS transistor P1 changes according to the magnitude of the power source noise, the filter effect of the low pass filter containing the resistance component also varies. In this regard, when the resistance component of the low pass filter is R and the capacity component is C, a critical frequency $fc = 1/2\pi RC$. Therefore, when the resistance component of the P-channel MOS transistor P1 increases according to the increase in the power source noise, the critical frequency fc of the low pass filter is lowered. Thereby, the high-frequency power source noise generated on the power source line PL1 can be effectively absorbed.

Similarly, the low pass filter is inserted in the ground line SL1. The low pass filter is formed by using a resistance component of the N-channel MOS semiconductor transistor N1 which receives the potential of the power source line PL1 at its gate and the capacitor C1. When the amount of fall in the potential of the node NA on the power source line PL1 increases due to the increase of the power source noise, the resistance component of the N-channel MOS transistor N1 increases. Consequently, the critical frequency fc of the low pass filter is lowered as the power source noise increases. Thus, the high-frequency power source noise generated in the ground line SL1 can be absorbed effectively.

On the other hand, when the power source noise is small, the resistance components of the P-channel MOS transistor P1 and the N-channel MOS transistor N1 become small, reducing the filter effect. In this case, it becomes possible to suppress the fall in the power source voltages in the power source line PL1 and the ground line SL1.

Now, as a comparative example for the semiconductor device of the present embodiment shown in FIG. 2, a description will be given of the structure of a semiconductor device in which the low pass filter includes a resistor and a capacitor.

Figure 4:
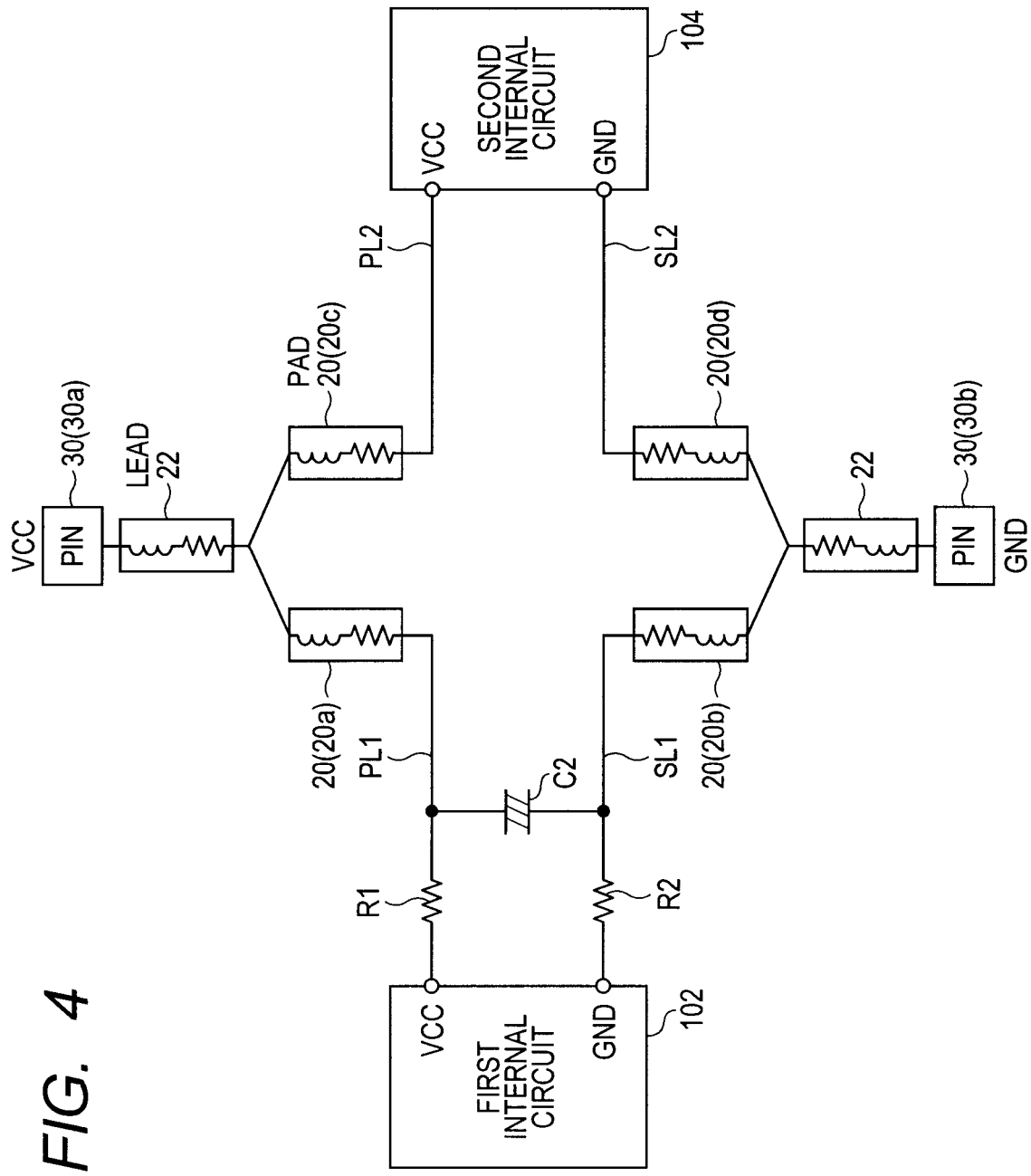
FIG. 4 shows a configuration of a comparative example of a s semiconductor device according to an embodiment of the present embodiment.

Referring to FIG. 4, the semiconductor device of the present comparative example differs from the semiconductor device of FIG. 2 in that, in place of the P-channel MOS transistor P1, the N-channel MOS transistor N1, and the capacitor C1, it includes a resistor R1 inserted in the power source line PL1, a resistor R2 inserted in the ground line SL1, and a capacitor C2.

In the structure shown in FIG. 4, the low pass filter is formed by using the resistor R1 and the capacitor C2, and the power source noise on the power source line PL1 is absorbed by the low pass filter. Similarly, the low pass filter is formed by using the resistor R2 and the capacitor C2, and the power supply noise on the ground line SL1 is absorbed by the low pass filter.

The resistors R1 and R2 contain, for example, polysilicon and are electrically coupled with an aluminum wiring layer, which includes the power source line PL1 and the ground line SL1. The resistors R1 and R2 have, for example, resistance values of several KΩ to tens of KΩ. The capacitor C2 has a capacity value of several-hundred pF.

Also in the structure shown in FIG. 4, when the first internal circuit 102 is operated and the power source noise is generated in the power source line PL1 and the ground line SL1, the power source noise is absorbed by the low pass filter which includes the resistors R1 and R2 and the capacitor C2. Accordingly, the power source noises on the power source line PL1 and the ground line SL1 are prevented from being transmitted to the power source line PL2 and the ground line SL2 of the second internal circuit 104 through the pin terminals 30a and 30b.

However, in the structure shown in FIG. 4, the filter effect of the low pass filter depends on the resistance values of the resistors R1 and R2 to be inserted in the power source line PL1 and the ground line SL1, respectively. Therefore, in order to reliably absorb the power source noise, it is necessary to set the resistance value to a higher value. As a result, the fall in the power source voltage in the power source line PL1 and the ground line SL1 becomes prominent, which may affect the operation of the second internal circuit 104.

On the other hand, when the capacity value of the capacitor C2 is increased instead of the resistance values of the resistors R1 and R2 being raised, as the occupancy area of the capacitor C2 increases, the circuit area of the semiconductor device increases.

On the contrary, in the semiconductor device according to the present embodiment, the filter effect of the low pass filter varies according to the magnitude of the power source noise. Therefore, when the power source noise is large, the filter effect can be raised. On the other hand, when the power source noise is small, the fall in the power source voltage can be suppressed. Since it is not necessary to provide a resistor of a high resistance value, the fall in the power source voltage can be suppressed. Moreover, the power source noise can be absorbed with use of the capacitor whose capacity value is small. Thus, it becomes possible to reduce the area of the semiconductor device.

Hereafter, referring to the drawings, an explanation will be given of the result of the comparison of the filter effects for the power source noise during the operation of the first internal circuit 102 between the semiconductor device of the present embodiment and the semiconductor device of the comparative example.

FIG. 5 shows, in the semiconductor device according to the present embodiment, how the potential of each of the power supply nodes of the first and second internal circuits 102 and 104 varies from the point where the first internal circuit 102 starts its operation. FIG. 6 shows, in the semiconductor device according to the comparative example, how the potential of each of the power supply nodes of the first and second internal circuits 102 and 104 varies from the point where the first internal circuit 102 starts its operation. In addition, characteristics shown in FIGS. 5 and 6 are simulation results obtained by conducting a large-signal nonlinear circuit analysis based on each of the circuit configurations shown in FIGS. 2 and 4.

Referring to FIG. 5(a), when the first internal circuit 102 starts its operation, an electric current flowing in the power source line PL1 changes steeply. Therefore, the potential of the power source line PL1 is overlapped with a power source noise of high frequency. The high-frequency power source noise is absorbed by the low pass filter including the P-channel MOS transistor P1 and the capacitor C1. As a result, as shown in FIG. 5(b), the power source noise transmitted to the power supply node of the second internal circuit 104 is also absorbed.

Figure 6A:
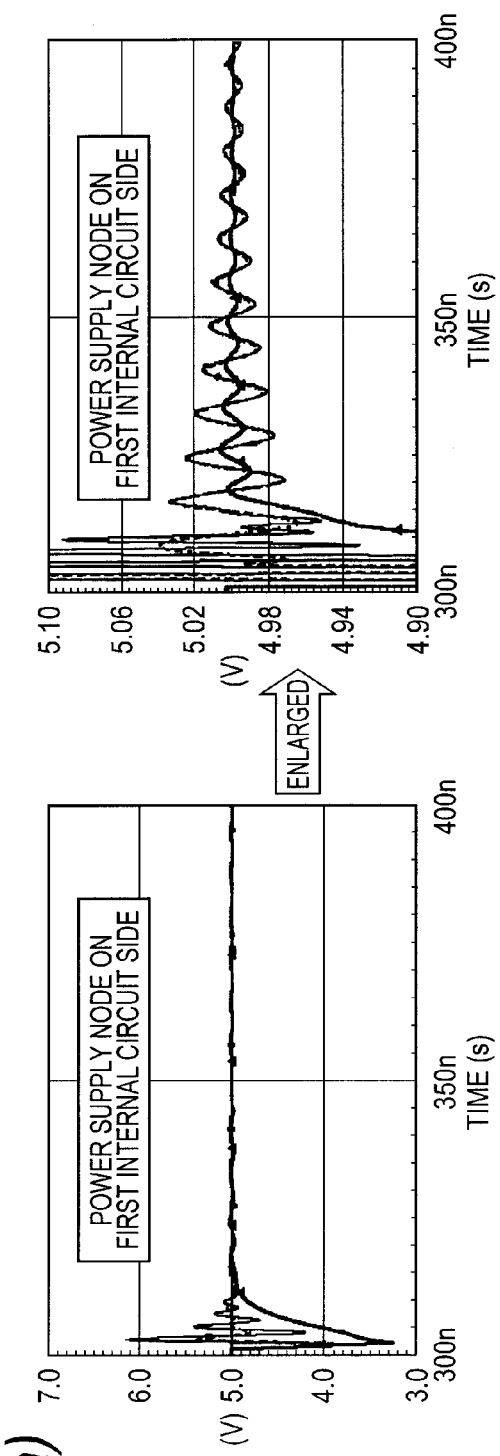
FIG. 6 is a diagram illustrating a filter effect for the power source noise in the semiconductor device according to the comparative example shown in FIG. 4.
Figure 6B:
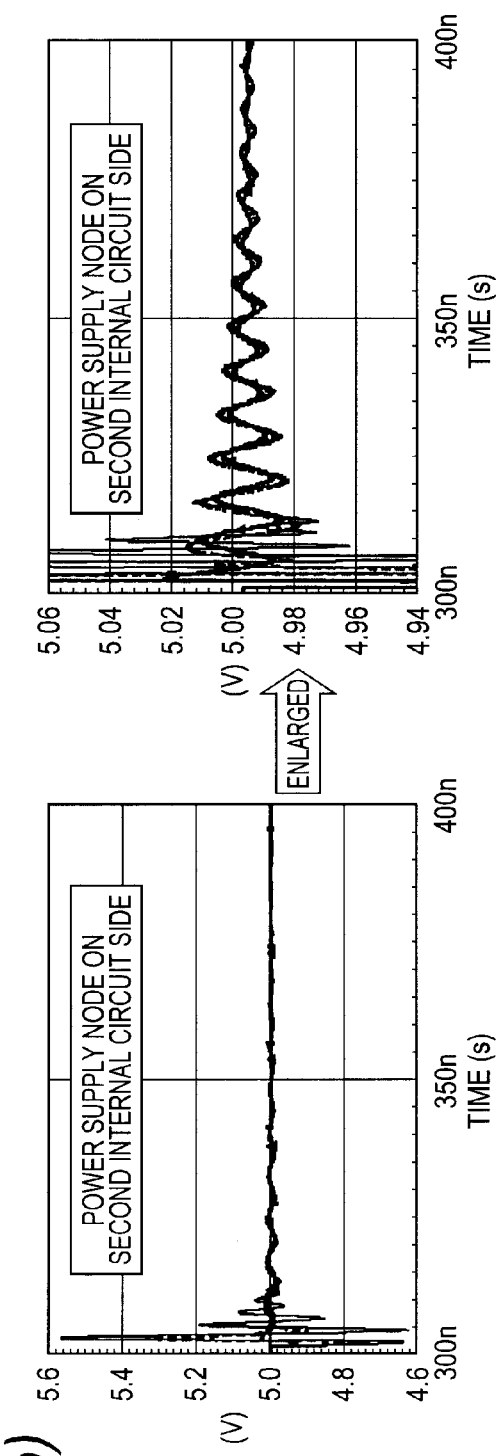

Similarly, also in FIG. 6(a), the high-frequency power source noise overlapped with the potential of the power source line PL1 is absorbed by the low pass filter including the resistor R1 and the capacitor C2. Since the larger the resistance value of the resistor R1 is, the greater the filter effect becomes, the power source noise becomes small. However, regardless of the magnitude of the resistance value, the time period until the potential comes to converge is substantially constant.

As apparent from the comparison of FIGS. 5 and 6, the time period until the potential of the power supply node reaches convergence of the semiconductor device according to the present embodiment is more shortened. Thus, according to the semiconductor device of the present embodiment, the potential level of the power source line and the ground line can be stably maintained.

As described above, according to the semiconductor device of the present embodiment, even in a case where the first internal circuit and the second internal circuit share the pin terminal, it is possible to prevent the power source noise generated at the time of the operation of the first internal circuit from affecting the second internal circuit. As a result, the number of pins of the semiconductor device can be reduced.

Moreover, in the above embodiment, such a low pass filter is provided that the filter effect varies according to the magnitude of the power source noise generated in the power source line or the ground line. Therefore, as compared to the low pass filter formed by using the resistor and the capacitor, a fall in the power source voltage can be reduced and, also, the area of the semiconductor device can be reduced.

(Modification)

Figure 7:
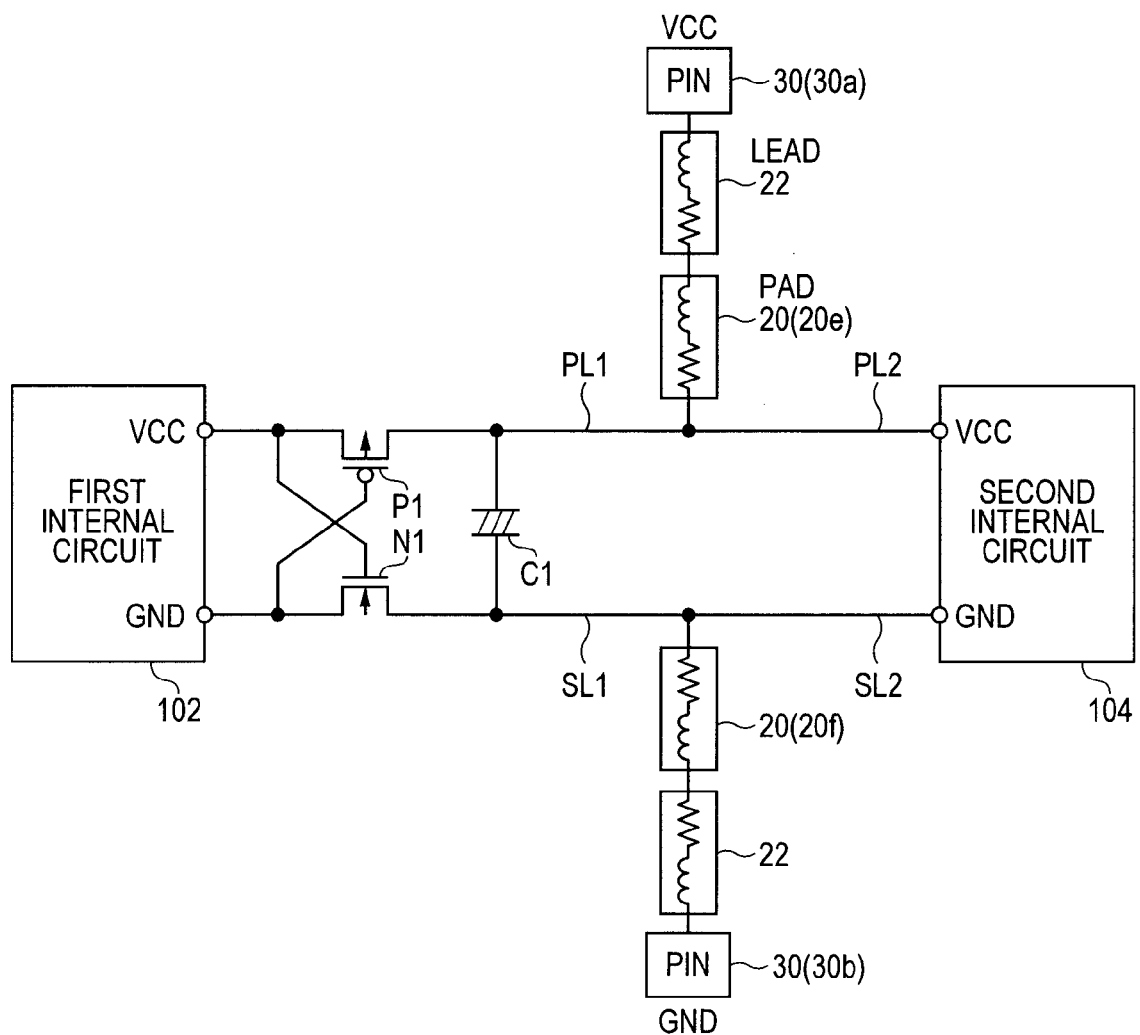
FIG. 7 is a diagram illustrating a configuration of a principal part of a semiconductor device according to a modification of the present embodiment.

FIG. 7 shows a structure of a principal part of a semiconductor device according to a modification of the present embodiment.

Referring to FIG. 7, the semiconductor device according to the present modification differs from the semiconductor device shown in FIG. 2 in that the first internal circuit 102 and the second internal circuitry 104 share the pin terminal 30 and the pad 20.

As to the semiconductor device according to the present modification also, in the power source line PL1, there is formed a low pass filter by using the P-channel MOS transistor P1 and the capacitor C1. Moreover, in the ground line SL1, there is formed a low pass filter by using the N-channel MOS transistor N1 and the capacitor C1. Therefore, a power source noise generated in the power source line PL1 or the ground line SL1 is absorbed by the low pass filter, and is prevented from being transmitted to a power supply node and a ground node of the second internal circuit 104 through the pad 20 and the pin terminals 30a and 30b. As a result, even in the structure where the first and second internal circuits 102 and 104 share the pad, the power source noise generated during the operation of the first internal circuit 102 can be prevented from affecting the second internal circuit 104, which allows the area of the semiconductor device to be reduced.

The embodiments disclosed herein should be considered as illustrative from all points of view and not limitative. The present invention is not defined by the above description but, rather, is defined by the claims and is intended to include the meanings equivalent to the claims as well as all of the modifications within the scope.

What is claimed is:

1. A semiconductor device, comprising:
   a first circuit supplied with a first power source potential and a second power source potential which is lower than the first power source potential;
   a second operating circuit supplied with the first power source potential and the second power source potential;
   a first terminal for receiving the first power source potential from the outside;
   a second terminal for receiving the second power source potential given from the outside;
   a first power source supply line for electrically coupling the first terminal with the first circuit;
   a second power source supply line for electrically coupling the second terminal with the first circuit;
   a third power source supply line for electrically coupling the first terminal with the second circuit;
   a fourth power source supply line for electrically coupling the second terminal with the second circuit;
   a capacitive element coupled between the first power source supply line and the second power source supply line;
   a first field-effect transistor of conductive type which is inserted in and coupled to the first power source supply line and whose gate is coupled to the second source power supply line; and
   a second conductive-type field-effect transistor which is inserted in and couple to the second power source supply line and whose gate is coupled to the first power source supply line.

2. A semiconductor device according to claim 1, wherein the first conductive-type field-effect transistor and the second conductive type field-effect transistor are MOS transistors and the capacitive element is a MOS capacity.

* * * * *